(12) United States Patent
Mezger et al.

(10) Patent No.: US 10,756,592 B2
(45) Date of Patent: Aug. 25, 2020

(54) CONTACTING ARRANGEMENT BETWEEN A STATOR AND A CIRCUIT BOARD

(71) Applicant: ebm-papst Mulfingen GmbH & Co. KG, Mulfingen (DE)

(72) Inventors: Paul Mezger, Bad Mergentheim-Rengershausen (DE); Alexander Rybak, Bad Mergentheim (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 426 days.

(21) Appl. No.: 15/490,929

(22) Filed: Apr. 19, 2017

(65) Prior Publication Data

US 2017/0310191 A1 Oct. 26, 2017

(30) Foreign Application Priority Data

Apr. 22, 2016 (DE) .................... 10 2016 107 543

(51) Int. Cl.
| | |
|---|---|
| *H02K 5/22* | (2006.01) |
| *H02K 3/52* | (2006.01) |
| *H02K 11/33* | (2016.01) |
| *H05K 3/32* | (2006.01) |
| *H02K 15/00* | (2006.01) |
| *H01R 4/242* | (2018.01) |
| *H01R 12/50* | (2011.01) |
| *H05K 1/18* | (2006.01) |

(52) U.S. Cl.
CPC ............ *H02K 5/225* (2013.01); *H02K 3/522* (2013.01); *H02K 11/33* (2016.01); *H02K 15/0068* (2013.01); *H05K 3/325* (2013.01); *H01R 4/242* (2013.01); *H01R 12/50* (2013.01); *H05K 1/182* (2013.01); *H05K 2201/1009* (2013.01)

(58) Field of Classification Search
CPC ........ H02K 5/225; H02K 11/33; H02K 3/522; H01R 4/242; H01R 12/50
USPC ........................................................ 310/71
See application file for complete search history.

(56) References Cited

FOREIGN PATENT DOCUMENTS

| | | |
|---|---|---|
| DE | 20212273 U1 | 7/2003 |
| DE | 102012106471 A1 | 2/2014 |
| DE | 102014201488 A1 | 7/2015 |
| DE | 102014201490 A1 | 8/2015 |
| DE | 202014005789 U1 | 10/2015 |
| DE | 102015208425 A1 | 11/2015 |
| EP | 0993095 A1 | 4/2000 |
| EP | 2557665 A1 | 2/2013 |

*Primary Examiner* — Terrance L Kenerly
(74) *Attorney, Agent, or Firm* — Harness, Dickey & Pierce, P.L.C.

(57) ABSTRACT

A stator for an electric motor, connected to a circuit board, comprising a stator housing in which several winding arrangements consisting of winding wires wound to form coils are arranged. Contact support receptacles are formed on the stator housing, in which, in each case, an insulation displacement contact element is introduced, which establishes an electrical contact between, in each case, a winding arrangement and a jumper wire on the circuit board.

8 Claims, 6 Drawing Sheets

CONTACTING ARRANGEMENT BETWEEN A STATOR AND A CIRCUIT BOARD

CROSS-REFERENCE TO RELATED APPLICATIONS

Figure 1:
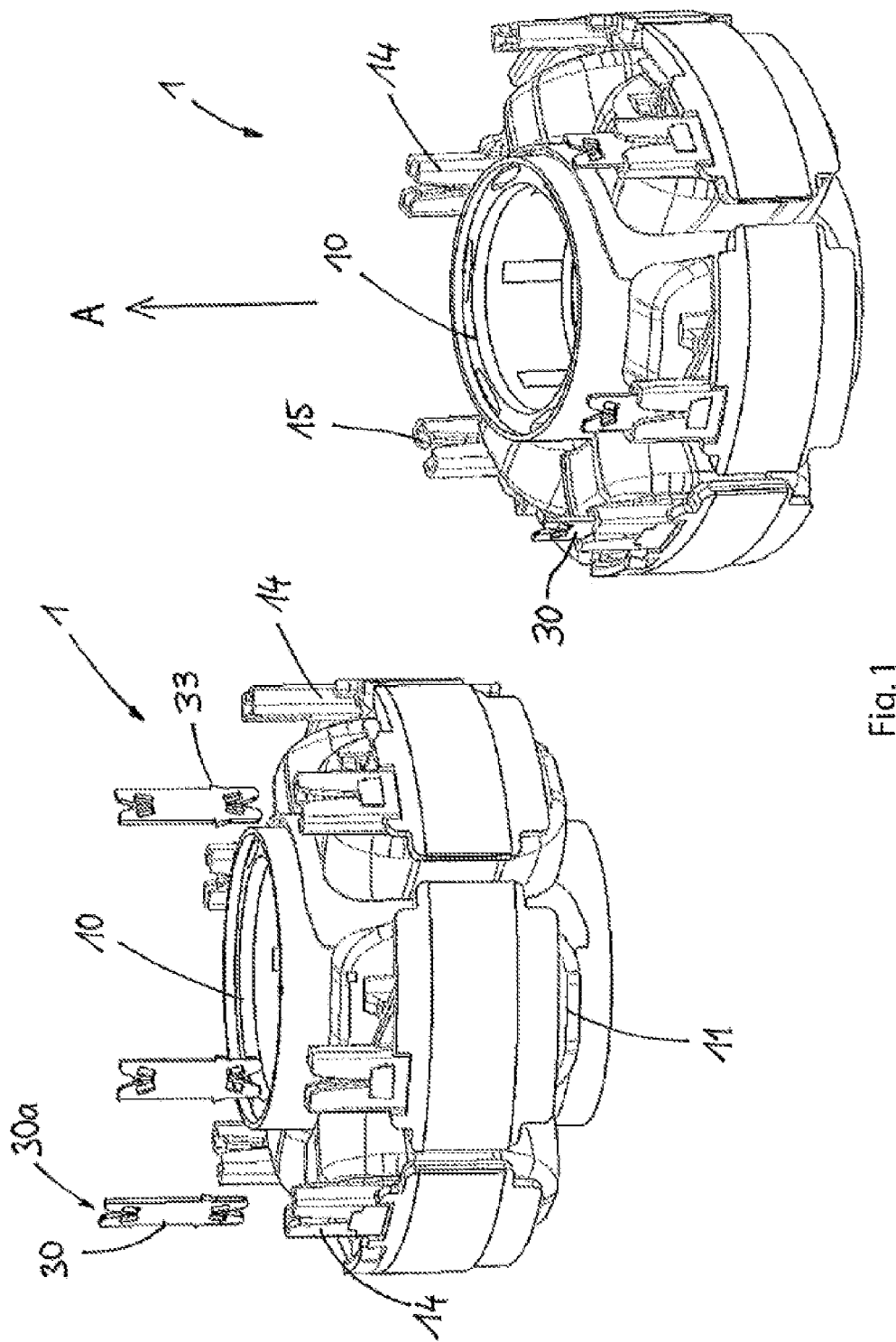

This application claims the benefit and priority of German Patent Application No. 10 2016 107 543.4, filed Apr. 22, 2016. The entire disclosure of the above application is incorporated herein by reference.

FIELD

The disclosure relates to a stator with a circuit board and to a method for producing a contacting arrangement between a stator and a circuit board.

BACKGROUND

Electric motors according to the prior art consist substantially of two components, namely the stator with the windings thereof and the rotor.

The stator of an electromotor is in a fixed position, while the rotor can turn relative to the stator. On the stator, winding frames, around which the enameled wires are wound, are arranged. Such windings are referred to below as winding arrangement or generally as stator winding.

The enameled wires, which are wound in each case to form a coil and which lead away from these winding frames, must be electrically connected to the conducting structure in the interior of the electric motor, so that the windings can be energized.

The electrical connection of the winding wires to the conducting structure is usually established by welding or soldering. In this context, first, the enameled wires are connected to intermediate clamps, and the intermediate clamps in turn are connected to an additional conducting structure by the connection process.

However, this has the disadvantage that the electrical connection can be affected by a defective welding. In addition, the production is relatively expensive depending on the number of the connections.

From DE 10 2015 208 425 DE, an improved solution is disclosed, in which a connecting structure for a stator and a circuit board is proposed, wherein the connecting structure has connection openings for receiving stator enameled wires, and the stator and the circuit board are electrically connected to one another. The connecting structure is characterized in that, moreover, on the circuit board, connection clamps are located, which are arranged in such a manner that the electrical connection of the circuit board to the stator is implemented in that the connection clamps are inserted into the connection openings. As an advantageous design, a solution is proposed here in which the connection clamps are arranged so that, after the insertion into the connection opening, they contact the enameled wires directly and establish a conducting connection, as a result of which the electrical connection of the stator to the circuit board is established. The connection clamps on the circuit board and the connection openings on the stator are inserted directly in one another, so that the connection clamps cut into the insulation layer of the enameled wires in the connection openings, and a conducting connection is formed, as a result of which the electrical connection of the circuit board to the stator is established.

From EP 2 557 665 A1, a stator for an electric motor is known, in particular for an external rotor motor, comprising a base body with a laminated stator core as well as with stator windings arranged on the laminated stator core, each winding having a winding wire start and a winding wire end, wherein each winding wire start is connected to contact pins, wherein the base body is overmolded with a sheath made of plastic, from which the contact pins protrude at least partially. For lowering the production technological expenditure, it is proposed that a contact holder, which together with the base body is surrounded by the sheath, is slipped over the free end of the contact pins onto the base body, wherein the contact holder, sealingly and without gap, encloses the contact pins with a sealing section.

DE 20212273 U1 relates to a stator for an electric motor, in particular for an external rotor motor, consisting of a laminated stator core with stator windings and with at least one insulation element arranged on the front side and consisting of an interconnection arrangement for interconnecting winding wires of the stator windings to electrical connection lines, wherein, in the insulation element, contact elements, implemented using the insulation displacement contact technology, are held for the contacting of the winding wires and of the connection lines.

EP 0 993 095 A1 describes a stator, the interconnection arrangement of which comprises insulation displacement contact elements which are seated in special contact chambers of the front-side insulation element on the face. In concrete terms, the contact chambers consist of at least of one multiple-contact chamber which is formed by sub-chambers, on the one hand, of the insulation element (insulation end plate) overmolded on the laminated core, and, on the other hand, of an additional wiring plate which is attached on the winding head side, in such a manner that, in the mounted state of the wiring plate, the sub-chambers are arranged adjacently next to one another, wherein they receive a common contact element connecting the sub-chambers. Here, during production, ends of the winding wires are led through the contact chamber. After all the windings have been produced, the wiring plate is placed on and fastened to the winding head side of the stator. Then, all the contact chambers are provided with insulation displacement contact elements, in that the latter are inserted into the chambers. In the process, a contacting of the winding wires extending through the contact chambers occurs automatically, in that, by means of a slot-shaped conductor receptacle, the insulation is cut through, and the wire is clamped with electrical contact (insulation displacement contact technology).

Subsequently, the external connection lines are pressed in accordance with the required interconnection of the stator into slots of the contact chambers and contact elements. Here too, the insulation of the connection lines is cut through, and as a result the electrical contact is established. It is only after this connection of the external connection lines that the additional mounting of a rotor with the shaft thereof can occur, and the motor can be run through other work steps until the manufacture thereof is completed. Thus, the external connection lines in each case have to be connected individually one after the other and, in addition, already at a very early production stage. This is disadvantageous, in particular since the further production is encumbered with the connection lines, i.e., the connection lines could impede the further course of production and mounting.

The disadvantage of the above-mentioned solutions known from the prior art is the fact that they continue to be relatively elaborate and accordingly relatively expensive in terms of the mounting, and, depending on the design, they still result in complex arrangements and a high number of parts for producing of the connections with the windings of the circuit board.

SUMMARY

Therefore, the underlying aim of the disclosure is to overcome the afore-mentioned disadvantages and to provide a cost effective, simple and universally usable solution for a connection between a stator and a circuit board.

This aim is achieved by a method for producing a connection between a stator and a circuit board.

The basic idea of the present disclosure consists in producing a particularly simple, compact and efficient connection design between the winding wires and the circuit board. For this purpose, for the electrical contact with the winding wires, insulated wire sections in the form of jumper wires are provided on the circuit board, preferably in or parallel to the plane of the circuit board, in order to contact these jumper wires by means of an insulation displacement contact terminal of an insulation displacement contact.

Therefore, according to the disclosure, a stator, in particular an electric motor stator with a circuit board, is proposed, which comprises a stator housing in or on which multiple winding arrangements (stator windings) consisting of winding wires are arranged, wherein, furthermore, contact support receptacles are formed on the stator housing, receptacles in which, in each case, an insulation displacement contact element is introduced, which establishes or is to establish an electrical contact in each case between a winding arrangement and a jumper wire on the circuit board.

In a particularly advantageous design of the disclosure, it is provided that the insulation displacement contact elements provide at least one insulation displacement contact connecting terminal, which protrudes from the contact support receptacle (in which the insulation displacement contact element is mounted) and, at the insulation displacement contact connecting terminal, with the insulation displacement terminations thereof, cuts through the insulation of a jumper wire provided for the contacting on the circuit board.

It is particularly advantageous if the respective jumper wire extends in the area in which an electrical connection with an insulation displacement contact element is established, within or parallel to the plane of extension of the circuit board. In this manner, a particularly simple mounting in an overall compact design can be implemented, since, in that case, the mounting direction can extend transversely to the plane of the circuit board, while the circuit board can be arranged in axial direction A of the stator at one end thereof directly above the stator housing.

In another advantageous design of the disclosure, it is provided that, for contacting the insulation displacement contact elements, the respective jumper wires of the circuit board with the contacting area thereof extend above or below an opening provided in the circuit board. As a result, on the one hand, a very compact design can be implemented, while, in addition, a visual checking of the insulation displacement contact connection, for example, through the circuit board opening is possible.

In other words, this means that, in the contacting state, the insulation displacement contact elements, at least by the front-side end thereof, protrude through the respective opening in the circuit board.

If the conductor bridge is attached below the circuit board opening, then, furthermore, a particularly compact mounting and a secure cutting through of the jumper wire can occur within each loaded contact support, since the insulation displacement contact elements can then be accommodated completely by the contact support receptacle. In such a case, it is also advantageous if the respective jumper wire provided for the connection is formed as a U-shaped jumper wire which protrudes from the bottom side of the circuit board in the direction of the stator housing. In the contacting state, the contacting section of the U-shaped jumper wire extends within the contact support receptacle.

In a particularly advantageous design of the disclosure, it is provided that the insulation displacement contact elements in each case are formed as double insulation displacement contact elements with two insulation displacement contact connecting terminals, wherein one insulation displacement contact connecting terminal cuts through the winding wire of a winding arrangement, while the second insulation displacement contact connecting terminal cuts through the insulation of a jumper wire on the circuit board.

It is also advantageous if the contact support receptacles are designed in the form of pockets for receiving the insulation displacement contact elements, wherein the respective insulation displacement contact element is inserted partially or completely into the pockets in axial direction A of the stator.

Preferably, the insulation displacement contact elements are formed with a catch which catches the insulation displacement contact elements in the contact support receptacle or holds them in place to prevent them from falling out.

It is also advantageous if the jumper wires are formed from an enameled wire, from an insulated wire, or from a wire-shaped sheet metal tab sheathed by an insulation layer.

Another aspect of the present disclosure relates to a method for producing an electrical connection between a stator, as described above, and a circuit board, with the following steps:

a) positioning of a circuit board, which comprises jumper wires for the contacting with the winding arrangements of the stator, relative to the stator, in such a manner that the corresponding insulation displacement contact elements are axially aligned with the contacting jumper wires;

b) assembly of the stator and of the circuit board, so that the insulation displacement contact elements arranged correspondingly with respect to the jumper wires cut through the insulation of the jumper wire, and the jumper wire is brought in electrical contact with the respective insulation displacement contact element.

Other advantageous developments of the disclosure are represented in greater detail below together with the description of the preferred design of the invention in reference to the figures.

DRAWINGS

Figure 2:
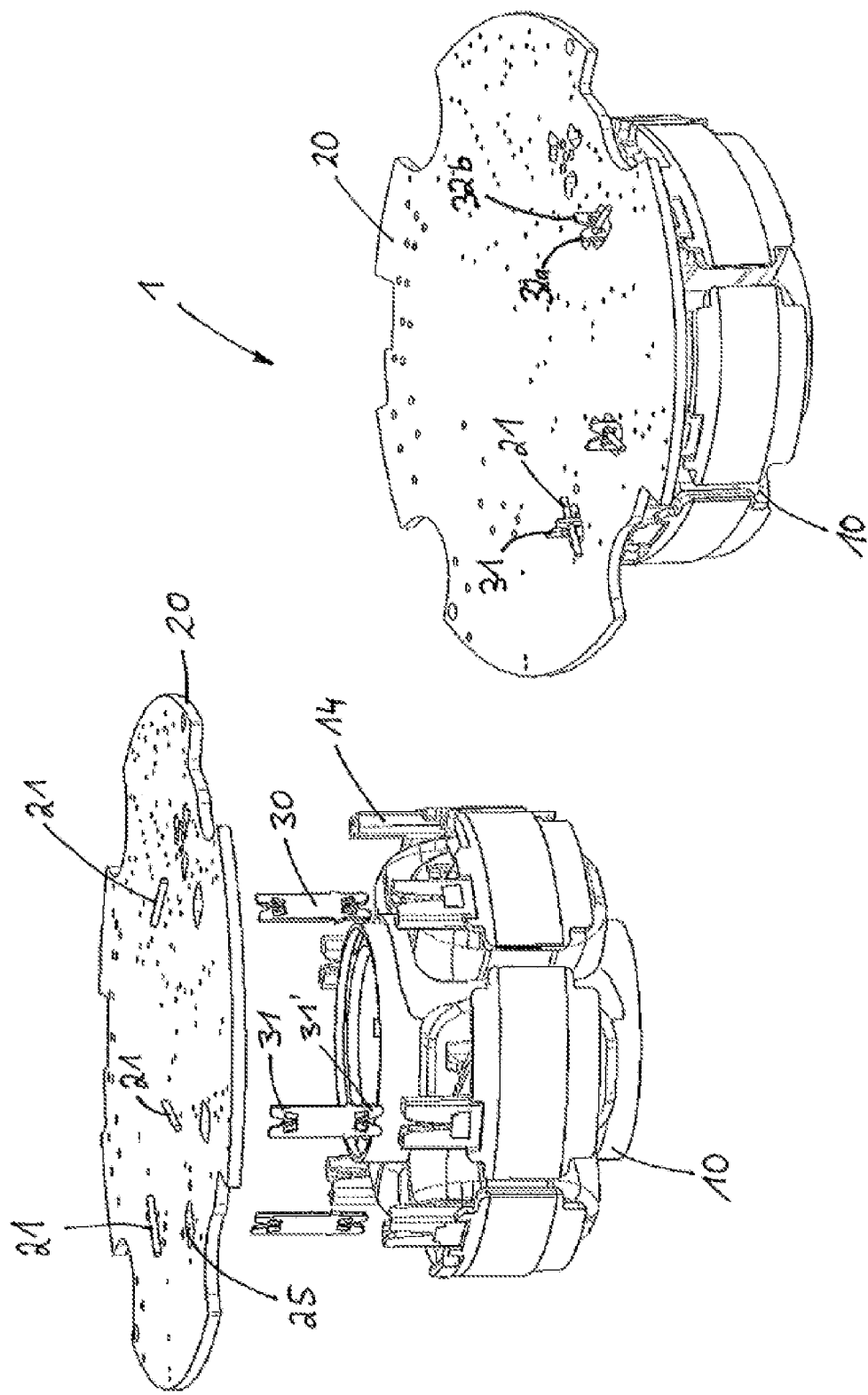
Figure 3:
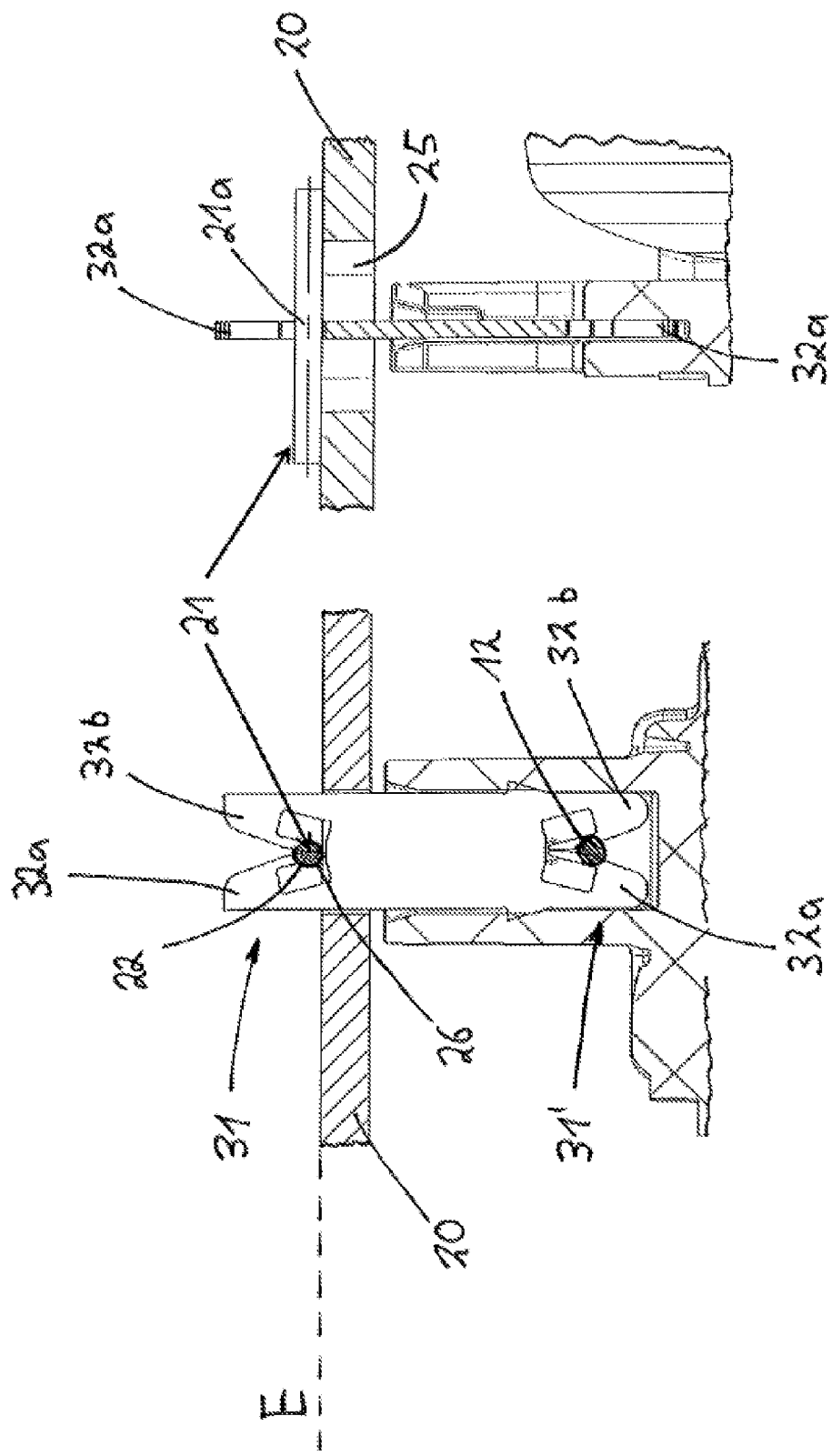
Figure 4:
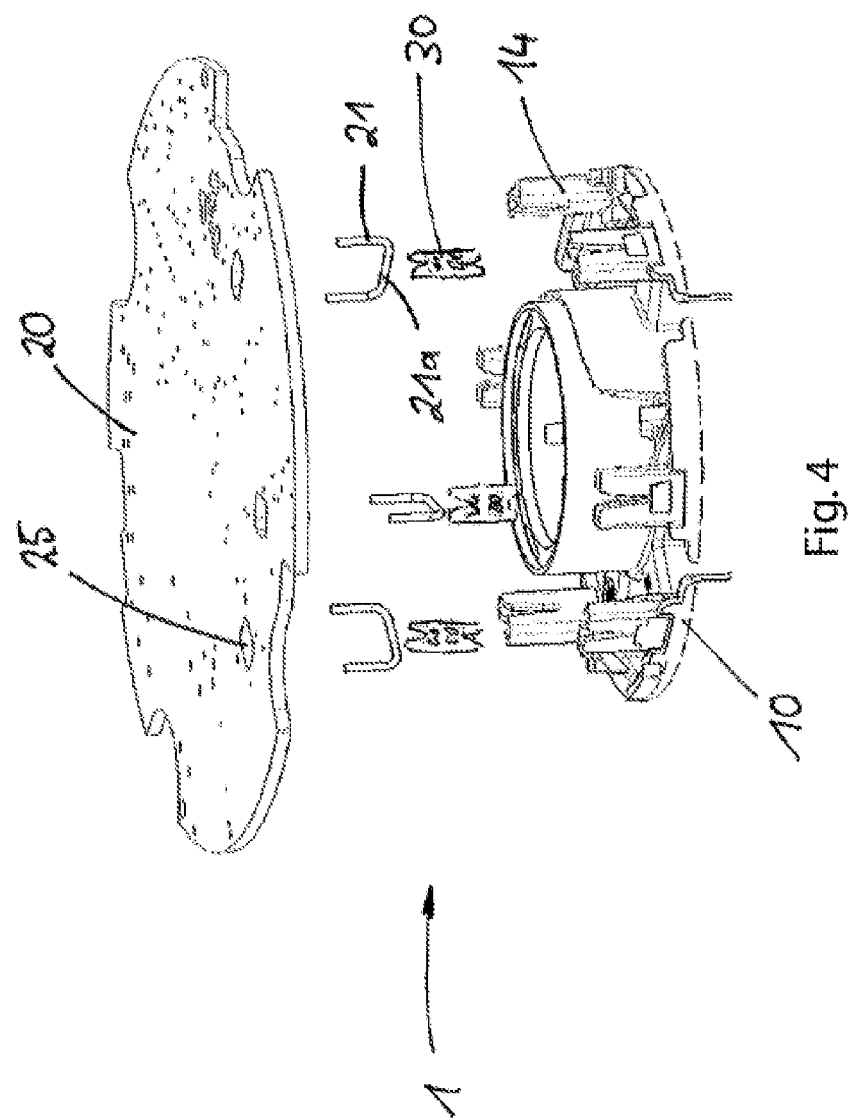
Figure 5:
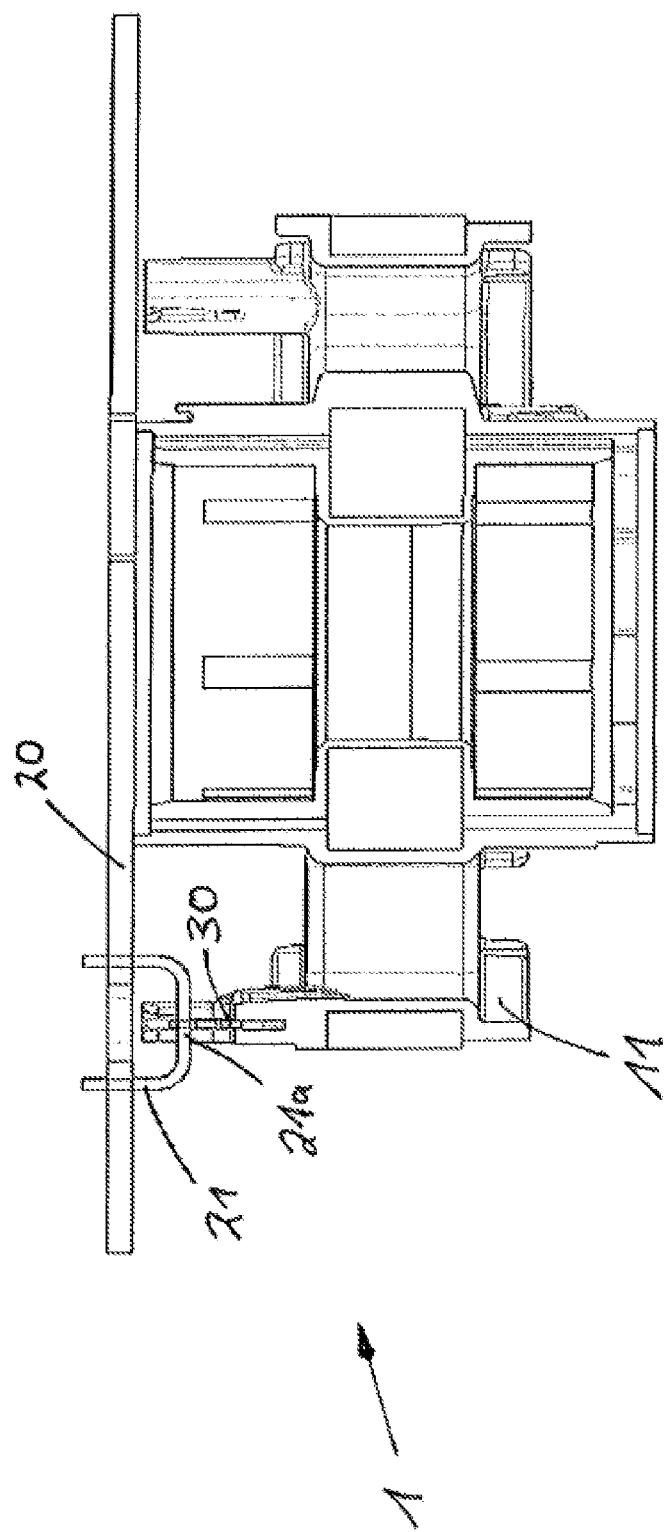
Figure 6:
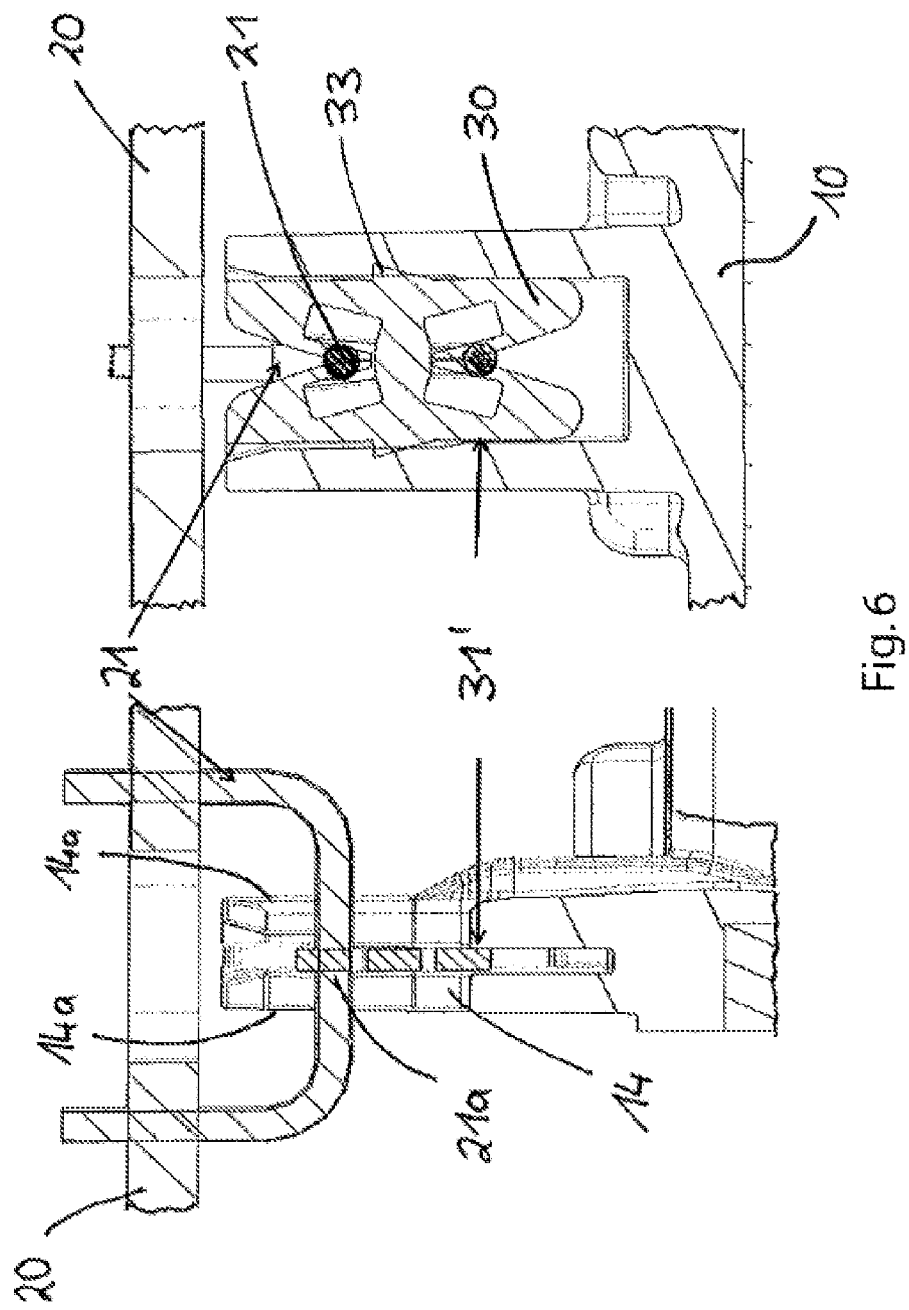

The figures show:

FIG. 1 an exploded representation of a first embodiment example of a stator according to the invention without circuit board;

FIG. 2 an exploded representation of the inventive stator according to FIG. 1 with a circuit board, in a preassembly position (left view) and in a contacting position (right view);

FIG. 3 a cross-sectional view through a contacting area of the first embodiment example;

FIG. 4 an exploded representation of an alternative embodiment example of an inventive stator with a circuit board to be mounted;

FIG. 5 a diagrammatic cross-sectional view through the embodiment example according to FIG. 4, and FIG. 6 a cross-sectional view through a contacting area of the embodiment example according to FIG. 4.

DESCRIPTION

Below, the disclosure is explained in further detail based on exemplary designs of the invention in reference to FIGS. 1 to 6, wherein identical reference numerals mark structurally and/or functionally identical features.

FIG. 1 is an exploded representation of a first embodiment example of a stator 1 for an electric motor not shown in further detail.

The stator 1 comprises a stator housing 10 in which six winding arrangements 11 (three pairs of stator windings), consisting of winding wires 12 wound to form coils, are arranged. Furthermore, on the stator housing 10, six contact support receptacles 14 are formed. In the left view of FIG. 1, three insulation displacement contact elements 30 are arranged above the pocket-like receptacles 15 of three of the contact support receptacles 14 present, which each have lateral hook-shaped catch elements 33, in order to hook, in the mounted position shown in FIG. 1 in the right view, in the pockets 15 of the contact support receptacles 14 (concerning this, see also the cross-sectional view in the mounted position in FIG. 3).

The electrical contact is made between, in each case, a certain winding arrangement 10 of a pair of two winding arrangements 10 and a jumper wire 21 of the circuit board 20, which is associated with this winding arrangement 10, as shown in further detail in the exploded representation of FIG. 2 in a preassembly position (left view) and in a contacting position (right view).

In this embodiment, the three insulation displacement contact elements 30 provide an insulation displacement contact connecting terminal 31, which protrudes on the front side from the contact support receptacle 14 and which, with the insulation displacement terminations 32*a*, 32*b* thereof, cuts through the insulation 22 of a jumper wire 21 provided on the circuit board. As can also be seen in FIG. 2, in the area in which an electrical connection is produced in between the conductor 26 by means of an insulation displacement contact element 30, the respective jumper wire 21 extends parallel to the plane of extension E of the circuit board 20 and thus transversely to the mounting direction which corresponds to the axial direction A of the stator.

The jumper wires 21 of the circuit board 20, with the contact area 21*a* thereof, extend in each case above openings 25 made in the circuit board 20.

FIG. 3 shows a cross-sectional view through a contacting area of the insulation displacement contact element 30 of the first embodiment example.

The insulation displacement contact elements 30 are here formed as double insulation displacement contact elements with two insulation displacement contact connecting terminals 31, 31', wherein one insulation displacement contact connecting terminal 31' cuts through the winding wire 12 of a winding arrangement 11, while the second insulation displacement contact connecting terminal 31 cuts through the insulation 22 of a jumper wire 21 on the circuit board 20, wherein the insulation displacement contact elements 30 extend with the insulation displacement contact connecting terminal 31 through the openings 25.

FIG. 4 shows an exploded representation of an alternative embodiment example of a stator with a circuit board to be mounted, and FIG. 5 shows a diagrammatic cross-sectional view through the embodiment example according to FIG. 4, wherein the jumper wires 21 are formed in the shape of a U and protrude on the bottom side of the circuit board 20.

Furthermore, in the cross-sectional view through a contacting area of this embodiment example from FIG. 4, one can see that the insulation displacement contact elements 30 with the insulation displacement contact connecting terminal 31 do not protrude from the contact support receptacle 14 on the front side as in the first embodiment example, but instead the insulation displacement contact elements 30 are accommodated completely by the contact support receptacle 14. In this context, it must be ensured that the side walls 14*a* of the contact support receptacle 14 are sufficiently open to the side so that the wire of the jumper wire can plunge sufficiently deeply into the contact support receptacle 14.

The mounting occurs with the following steps:

i) positioning of the circuit board 20, which has the matching number of jumper wires 21 for the contacting with the winding arrangements 10 of the stator 1, relative to the stator 1, in such a manner that the corresponding insulation displacement contact elements 30 are aligned axially with the jumper wires 21 to be contacted, and ii) assembly of the stator 1 and of the circuit board 20, in such a manner that the insulation displacement contact elements 30 arranged correspondingly with respect to the jumper wires 21 cut through the insulation of the respective jumper wire 21, and the jumper wire 21 is brought in electrical contact with the respective insulation displacement contact element 30.

The invention claimed is:

1. A stator for an electric motor, connected to a circuit board, the stator comprising:
 a circuit board with a jumper wire connected to the circuit board;
 a stator housing with several winding arrangements arranged on the housing, each winding arrangement including winding wires wound to form coils, wherein, contact support receptacles are formed on the stator housing, an insulation displacement contact element is introduced into at least one of the receptacles, the insulation displacement contact element is formed as double insulation displacement contact elements with two insulation displacement contact connecting terminals, wherein one insulation displacement contact connecting terminal cuts through the winding wire of a winding arrangement, while the second insulation displacement contact connecting terminal cuts through the insulation of a jumper wire on the circuit board, in order to receive insulation displacement contact elements, the contact support receptacles form pocket-like receptacles, into which the respective insulation displacement contact element is inserted in axial direction of the stator so that electrical contact, in each case, is established between the winding arrangement and the jumper wire.

2. The stator according to claim 1, wherein the insulation displacement contact elements provide at least one insulation displacement contact connecting terminal and, with the insulation displacement terminations thereof, cuts through the insulation or the cable sheath of a jumper wire provided directly on or at the circuit board.

3. The stator according to claim 1, wherein the respective jumper wire extends in the area in which an electrical connection with an insulation displacement contact element is established, within or parallel to the plane of extension of the circuit board.

4. The stator according to claim 1, wherein for the contacting of the insulation displacement contact elements, the respective jumper wires of the circuit board with a contacting area thereof extend above or below an opening made in the circuit board.

5. The stator claim 1, wherein the insulation displacement contact elements are formed with a catch, which catches the insulation displacement contact elements in the contact support receptacle.

6. The stator according to claim 1, wherein the jumper wires are formed from an enameled wire, from an insulated wire, or from a wire-shaped sheet metal tab sheathed by an insulation layer.

7. The stator according to claim 4, wherein in the contacting state, the insulation displacement contact elements, at least by a front-side end thereof, protrude through the respective opening in the circuit board.

8. A method for producing an electrical connection between a stator according to claim 1 and a circuit board, the method comprising:
   a) positioning the circuit board, which comprises jumper wires for the contacting with the winding arrangements of the stator, relative to the stator, in such a manner that the corresponding insulation displacement contact elements are axially aligned with the contacting jumper wires;
   b) assembling the stator and the circuit board, so that the insulation displacement contact elements arranged correspondingly with respect to the jumper wires cut through the insulation of the jumper wire, and the jumper wire is brought in electrical contact with the respective insulation displacement contact element.

* * * * *